US011158703B2

(12) United States Patent
Gendron-Hansen et al.

(10) Patent No.: US 11,158,703 B2
(45) Date of Patent: Oct. 26, 2021

(54) SPACE EFFICIENT HIGH-VOLTAGE TERMINATION AND PROCESS FOR FABRICATING SAME

(71) Applicant: Microchip Technology Inc., Chandler, AZ (US)

(72) Inventors: Amaury Gendron-Hansen, Bend, OR (US); Dumitru Sdrulla, Bend, OR (US)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 16/446,557

(22) Filed: Jun. 19, 2019

(65) Prior Publication Data

US 2020/0388670 A1  Dec. 10, 2020

Related U.S. Application Data

(60) Provisional application No. 62/857,497, filed on Jun. 5, 2019.

(51) Int. Cl.
*H01L 29/66* (2006.01)
*H01L 29/06* (2006.01)
(Continued)

(52) U.S. Cl.
CPC ........ *H01L 29/0619* (2013.01); *H01L 21/761* (2013.01); *H01L 29/1608* (2013.01);
(Continued)

(58) Field of Classification Search
CPC ............. H01L 29/0615; H01L 29/7811; H01L 29/78232; H01L 21/761; H01L 29/0619;
(Continued)

(56) References Cited

U.S. PATENT DOCUMENTS 4,754,310 A * 6/1988 Coe .................... H01L 29/0634
257/287
5,506,421 A * 4/1996 Palmour ............. H01L 29/7813
257/77
(Continued)

FOREIGN PATENT DOCUMENTS

JP    h06151867 B    6/1999

OTHER PUBLICATIONS

PCT/US2019/061857, International Search Report and Written Opinion, dated Feb. 24, 2020.

*Primary Examiner* — Jay C Kim
(74) *Attorney, Agent, or Firm* — Glass & Associates; Kenneth Glass; Kenneth D'Alessandro

(57) ABSTRACT

A high-voltage termination for a semiconductor device includes a substrate of a first conductivity type, an implanted device region of a second conductivity type of the semiconductor device, a shallow trench disposed in the substrate adjacent to the implanted device region, a doped extension region of the second conductivity type extending between the implanted device region and a first edge of the shallow trench adjacent to the implanted device region, a junction termination extension region of the second conductivity type formed in the shallow trench contacting the extension region and extending past a second edge of the shallow trench opposite the implanted device region, an insulating layer formed over at least a portion of the extension region and over the junction termination extension region, and a metal layer formed over the insulating layer extending into at least a portion of the shallow trench and electrically connected to the extension region.

14 Claims, 5 Drawing Sheets

Figure 1:
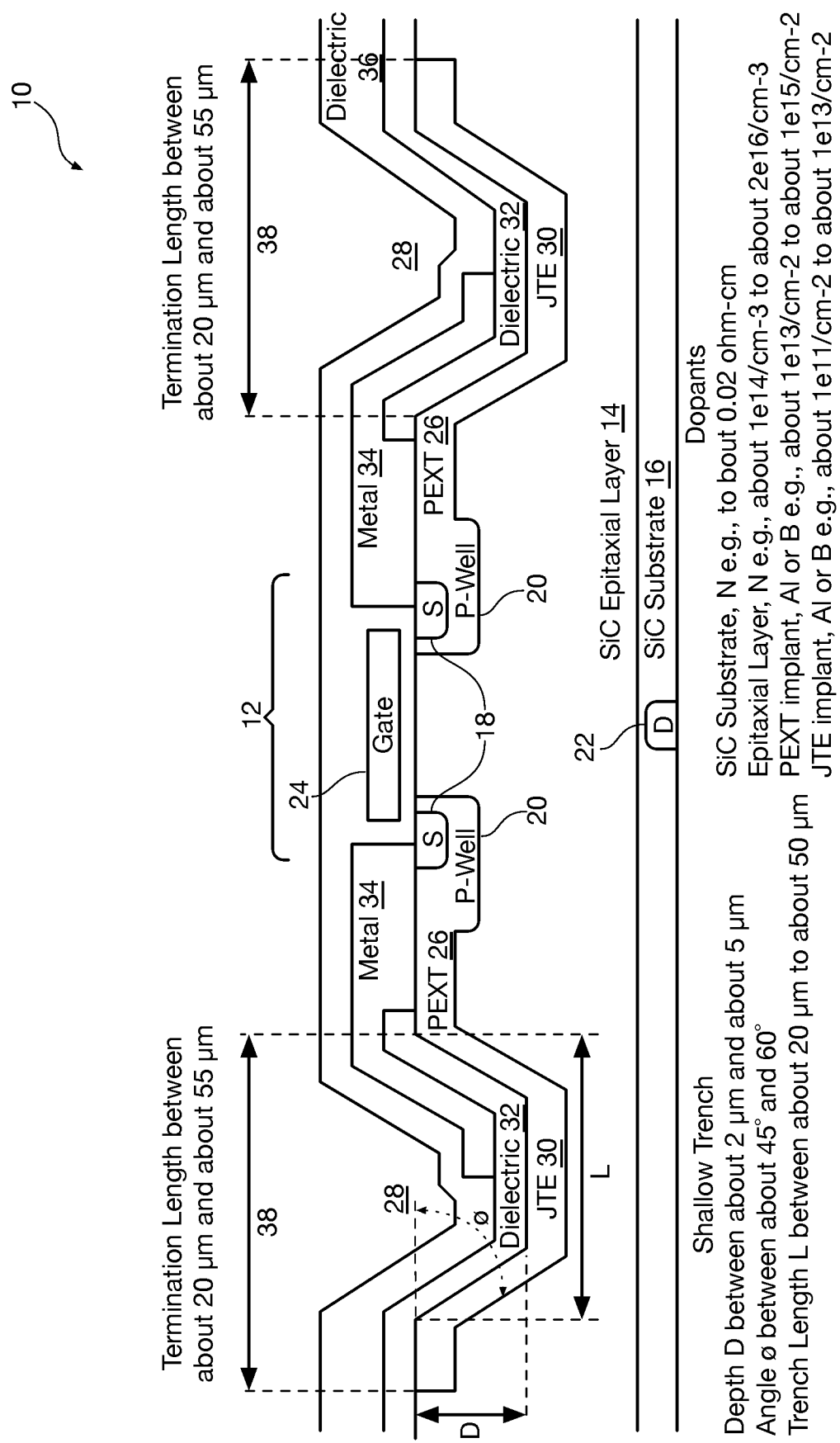

(51) Int. Cl.
*H01L 29/40* (2006.01)
*H01L 21/761* (2006.01)
*H01L 29/16* (2006.01)
*H01L 29/78* (2006.01)

(52) U.S. Cl.
CPC ...... *H01L 29/407* (2013.01); *H01L 29/66712* (2013.01); *H01L 29/7811* (2013.01)

(58) Field of Classification Search
CPC .............. H01L 29/1608; H01L 29/407; H01L 29/66712
USPC ........................................................ 257/367
See application file for complete search history.

(56) References Cited

U.S. PATENT DOCUMENTS

| | | | | |
|---|---|---|---|---|
| 6,054,748 A * | 4/2000 | Tsukuda | H01L 29/0615 | 257/487 |
| 6,365,932 B1 * | 4/2002 | Kouno | H01L 27/0255 | 257/133 |
| 6,495,871 B2 * | 12/2002 | Hattori | H01L 29/1095 | 257/279 |
| 7,078,781 B2 * | 7/2006 | Hatakeyama | H01L 29/0615 | 257/472 |
| 7,091,557 B2 * | 8/2006 | Deboy | H01L 29/0634 | 257/339 |
| 7,372,087 B2 * | 5/2008 | Chen | H01L 29/66068 | 257/263 |
| 7,498,634 B2 * | 3/2009 | Tsuzuki | H01L 27/0664 | 257/133 |
| 7,595,238 B2 * | 9/2009 | Tsuji | H01L 21/047 | 438/259 |
| 7,732,821 B2 * | 6/2010 | Suzuki | H01L 21/0465 | 257/335 |
| 7,821,028 B2 * | 10/2010 | Konig | H01L 29/417 | 257/129 |
| 7,956,423 B2 * | 6/2011 | Arai | H01L 21/823437 | 257/378 |
| 8,222,649 B2 * | 7/2012 | Miura | H01L 29/0615 | 257/77 |
| 8,232,610 B2 * | 7/2012 | Nakazawa | H01L 27/0255 | 257/401 |
| 8,274,086 B2 * | 9/2012 | Malhan | H01L 29/063 | 257/76 |
| 8,304,901 B2 * | 11/2012 | Watanabe | H01L 21/0495 | 257/734 |
| 8,519,477 B2 * | 8/2013 | Hsieh | H01L 29/7813 | 257/330 |
| 8,610,132 B2 * | 12/2013 | Masuda | H01L 29/66734 | 257/77 |
| 8,686,438 B2 * | 4/2014 | Hiyoshi | H01L 29/0661 | 257/77 |
| 8,786,024 B2 * | 7/2014 | Sugawara | H01L 29/0661 | 257/256 |
| 8,896,084 B2 * | 11/2014 | Sugawara | H01L 29/0638 | 257/471 |
| 8,952,430 B2 * | 2/2015 | Takaya | H01L 29/1608 | 257/288 |
| 9,059,086 B2 * | 6/2015 | Ebiike | H01L 29/0619 | |
| 9,093,517 B2 * | 7/2015 | Schmid | H01L 29/0646 | |
| 9,099,387 B2 * | 8/2015 | Tsuzuki | H01L 21/26586 | |
| 9,425,265 B2 * | 8/2016 | Van Brunt | H01L 29/861 | |
| 9,640,651 B2 * | 5/2017 | Takaya | H01L 29/1608 | |
| 9,691,891 B2 * | 6/2017 | Masuda | H01L 29/66068 | |
| 9,793,392 B2 * | 10/2017 | Kinoshita | H01L 29/7397 | |
| 9,853,139 B2 * | 12/2017 | Takaya | H01L 29/0623 | |
| 9,978,843 B2 * | 5/2018 | Takayanagi | H01L 29/1608 | |
| 10,008,592 B1 * | 6/2018 | Kojima | H01L 29/7811 | |
| 10,026,805 B2 * | 7/2018 | Konstantinov | H01L 29/872 | |
| 10,032,866 B2 * | 7/2018 | Kobayashi | H01L 29/0878 | |
| 10,090,379 B2 * | 10/2018 | Harada | H01L 29/0619 | |
| 10,229,969 B2 * | 3/2019 | Kagawa | H01L 29/7811 | |
| 10,236,372 B2 * | 3/2019 | Okumura | H01L 21/02378 | |
| 10,269,952 B2 * | 4/2019 | Kinoshita | H01L 29/0615 | |
| 10,283,460 B2 * | 5/2019 | Bu | H01L 21/02019 | |
| 10,340,332 B2 * | 7/2019 | Ren | H01L 29/7811 | |
| 10,439,060 B2 * | 10/2019 | Ohse | H01L 29/0626 | |
| 2001/0048132 A1 * | 12/2001 | Ito | H01L 29/7813 | 257/330 |
| 2002/0063300 A1 | 5/2002 | Miyajima | | |
| 2007/0170436 A1 * | 7/2007 | Sugawara | H01L 29/417 | |
| 2011/0272735 A1 | 11/2011 | Schmidt | | |
| 2013/0248886 A1 * | 9/2013 | Kitagawa | H01L 29/7397 | 257/80 |
| 2015/0108501 A1 | 4/2015 | Iwamuro et al. | | |
| 2017/0012136 A1 * | 1/2017 | Maegawa | H01L 29/407 | |
| 2017/0213908 A1 * | 7/2017 | Fursin | H01L 29/0615 | |
| 2018/0138288 A1 * | 5/2018 | Utsumi | H01L 21/0465 | |
| 2019/0172715 A1 * | 6/2019 | Zanetti | H01L 29/0619 | |
| 2020/0006494 A1 * | 1/2020 | Tsuji | H01L 29/0661 | |
| 2020/0020797 A1 * | 1/2020 | Suzuki | H01L 29/0692 | |

* cited by examiner

SPACE EFFICIENT HIGH-VOLTAGE TERMINATION AND PROCESS FOR FABRICATING SAME

TECHNICAL FIELD

The present invention relates to semiconductor device structures and manufacturing processes. More particularly, the present invention relates to a high-voltage termination structure for a semiconductor device and to a process for fabricating that structure.

BACKGROUND

For voltage nodes carrying 600 V and higher, the high-voltage termination structure accounts for a significant portion of the die total footprint, in some cases amounting to more than half of the footprint. Hence, reducing the length of the termination structure would reduce the size and cost of the dies.

Most of the prior-art high-voltage termination designs rely on floating field ring (FFR), junction termination extension (JTE), and/or deep trench designs. The FFR design provides a very robust termination however it has a large footprint (typically 10 times the thickness of the epitaxy). The JTE design is more compact (about 3 times the thickness of the epitaxy) but has the drawback of being highly sensitive to normal process variations. The deep trench design is very compact but expensive to fabricate in that it is difficult to control the dry etch process used.

BRIEF DESCRIPTION

The present invention relies on the combination of a shallow trench, a JTE region, and a field plate to provide a high breakdown voltage close to the full capability of the substrate, which may be a semiconductor substrate, a well formed in a semiconductor substrate or an epitaxial layer formed on a substrate.

The underlying principle is to suppress any high electric fields near convex junctions so that the avalanche breakdown of the termination is governed by the electric field of a planar junction.

The shallow trench allows the convex junction of the doped extension to be etched away. The JTE and field plate are designed to relax the electric field at the interface between the extension and the trench.

According to an aspect of the invention, a high-voltage termination for a semiconductor device includes a substrate of a first conductivity type, an implanted device region of a second conductivity type of the semiconductor device, a shallow trench disposed in the substrate adjacent to the implanted device region, a doped extension region of the second conductivity type extending between the implanted device region and a first edge of the shallow trench adjacent to the implanted device region, a junction termination extension region of the second conductivity type formed in the shallow trench contacting the extension region and extending past a second edge of the shallow trench opposite the implanted device region, an insulating layer formed over at least a portion of the extension region and over the junction termination extension region, and a metal layer formed over the insulating layer extending into at least a portion of the shallow trench and electrically connected to the extension region.

According to an aspect of the invention, a length of the shallow trench and the doped extension region together form a termination length of the high-voltage termination.

According to an aspect of the invention, a second insulating layer is formed over the metal layer and the insulating layer.

According to an aspect of the invention, sidewalls of the shallow trench are at angles between about 45° and about 60°.

According to an aspect of the invention, the substrate of the first conductivity type is an epitaxial layer disposed over an underlying substrate.

According to an aspect of the invention, the epitaxial layer is an epitaxial SiC layer, and the underlying substrate is a SiC substrate.

According to an aspect of the invention, the epitaxial SiC layer is doped with nitrogen, and the underlying SiC substrate is doped with nitrogen.

According to an aspect of the invention, the epitaxial SiC layer is doped with nitrogen to a concentration of from about $1e14/cm^3$ to about $2e16/cm^3$, and the underlying SiC substrate is doped with nitrogen to a resistivity of about 0.02 ohm-cm.

According to an aspect of the invention, the extension region is implanted with one of aluminum and boron, and the junction termination extension region is implanted with one of aluminum and boron.

According to an aspect of the invention, the extension region is implanted with one of aluminum and boron with a dose of between about $1e13/cm^2$ to about $1e15/cm^2$, and the junction termination extension region is implanted with one of aluminum and boron with a dose of between about $1e11/cm^2$ to about $1e13/cm^2$, According to an aspect of the invention, the doping of the junction termination extension region is less than the doping of the extension region.

According to an aspect of the invention, the shallow trench has a depth of between about 2 μm to about 5 μm, and a termination length defined by a width of the shallow trench and an extension of the junction termination extension region beyond the trench is selected to withstand a preselected blocking voltage.

According to an aspect of the invention, the termination length is between about 21 μm to about 55 μm.

According to an aspect of the invention, a method for forming a high voltage termination in a semiconductor device includes providing a substrate of a first conductivity type, performing an ion implantation to form an extension region of a second conductivity type opposite the first conductivity type in the substrate, forming a shallow trench in the substrate adjacent to an active area of the substrate, the shallow trench extending past an edge of the extension region, performing an ion implantation to form a junction termination extension region of the second conductivity type in the shallow trench and intersects the extension region, forming an insulating layer over the extension region and the junction termination extension region, and forming a metal layer formed over the insulating layer, the metal layer extending into the shallow trench, the metal layer electrically connected through a via in the insulating layer to the extension region.

According to an aspect of the invention, performing an ion implantation to form an extension region of a second conductivity type opposite the first conductivity type in the substrate comprises performing the ion implantation to form the extension region that extends from an edge of the shallow trench opposite the active area to define a termination length for the high-voltage termination.

According to an aspect of the invention, forming a shallow trench in the substrate comprises forming a shallow trench in the substrate having sidewalls disposed at angles between about 45° and about 60°.

According to an aspect of the invention, providing a substrate of a first conductivity type comprises providing a SiC epitaxial layer over a SiC substrate. According to an aspect of the invention, providing a substrate of a first conductivity type comprises providing a SiC epitaxial layer doped with nitrogen over a SiC substrate doped with nitrogen. According to an aspect of the invention, forming an extension region of a second conductivity type comprises performing an implantation with one of aluminum and boron, and with a dose of between about 1e13/cm$^2$ to about 1e15/cm$^2$, and forming the junction termination extension region of a second conductivity type comprises performing an implantation with one of aluminum and boron, and with a dose of between about 1e11/cm$^2$ to about 1e13/cm$^2$, and the doping of the junction termination extension region is less than the doping of the extension region.

According to an aspect of the invention, a transistor with high-voltage termination, includes a substrate of a first conductivity type, an active area in the substrate including source and drain regions of the transistor, a gate disposed over the source and drain regions, a shallow trench disposed in the substrate adjacent to the active area of the substrate, a doped extension region of a second conductivity type, opposite the first conductivity type, formed in the substrate and extending from a first edge of the shallow trench and contacting the source of the transistor, a junction termination extension region of the second conductivity type formed in the shallow trench and contacting the extension region, the junction termination region extending past a second edge of the shallow trench opposite the first edge, an insulating layer formed over at least a portion of the extension region and over the junction termination extension region, and a metal layer formed over the insulating layer, the metal layer extending into at least a portion of the shallow trench, the metal layer electrically connected through a via in the insulating layer to the extension region.

According to an aspect of the invention, the source region is disposed in a p-well formed in the substrate, and the doped extension region contacts the p-well.

According to an aspect of the invention, a length of the shallow trench and the doped extension region together form a termination length of the high-voltage termination for the transistor.

BRIEF DESCRIPTION OF THE DRAWING FIGURES

Figure 2A:
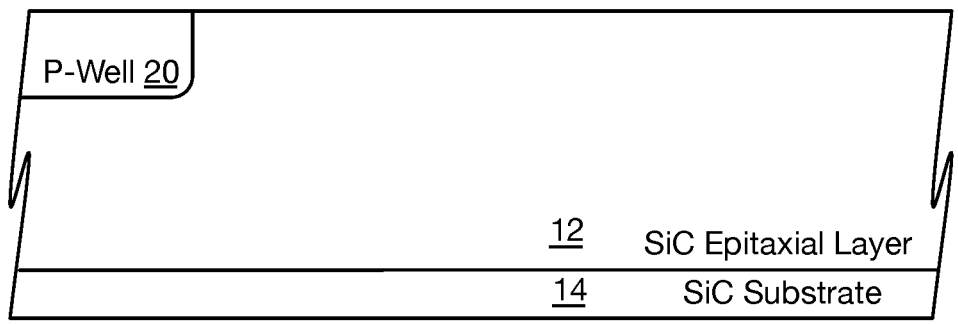
Figure 2B:
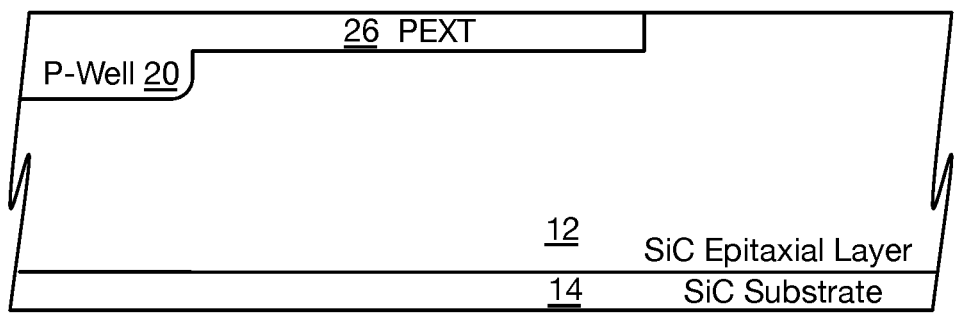
Figure 2C:
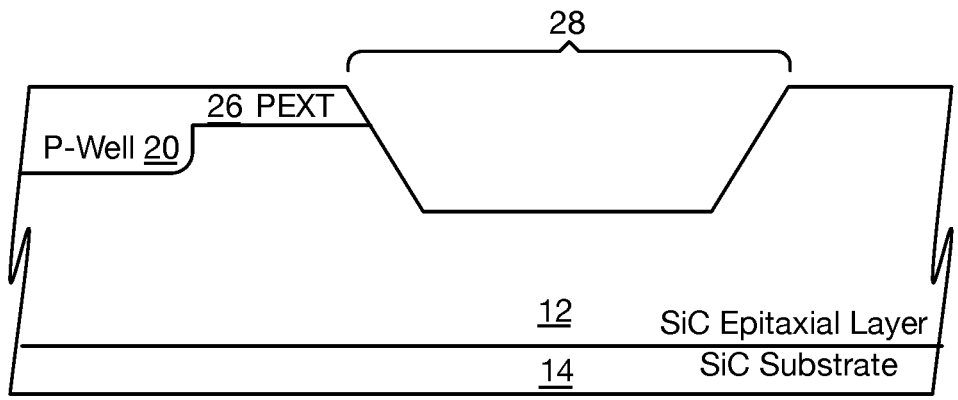
Figure 2D:
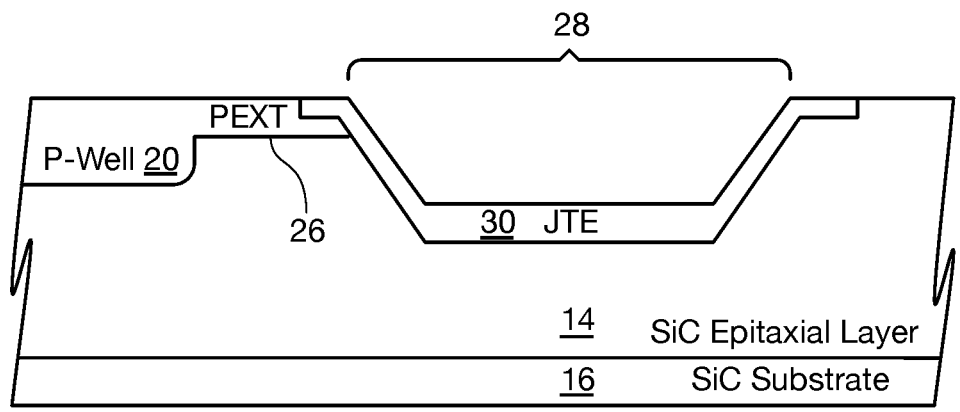
Figure 2E:
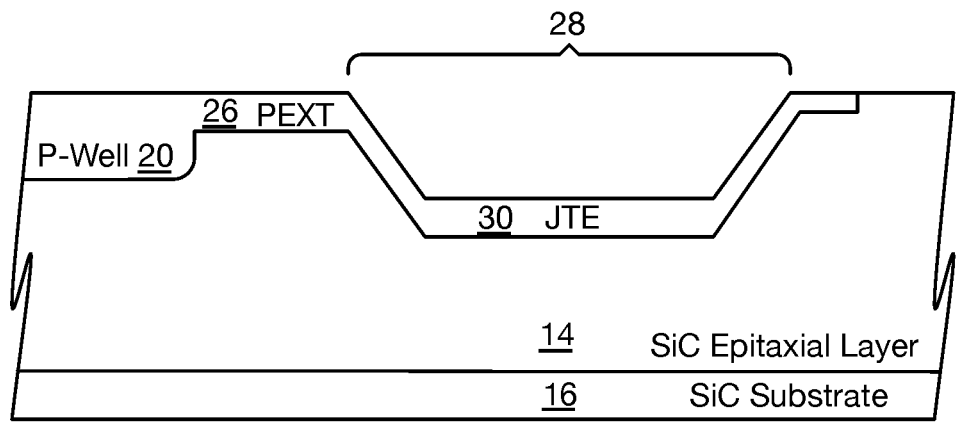
Figure 2F:
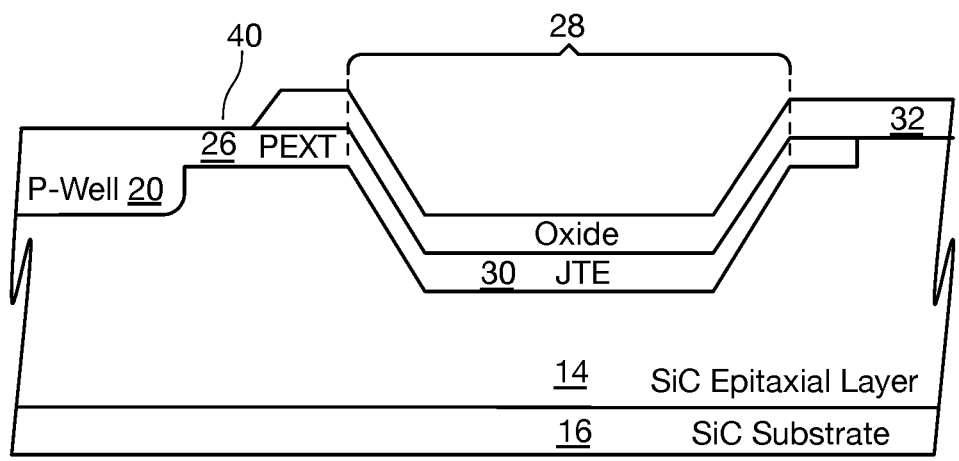
Figure 2G:
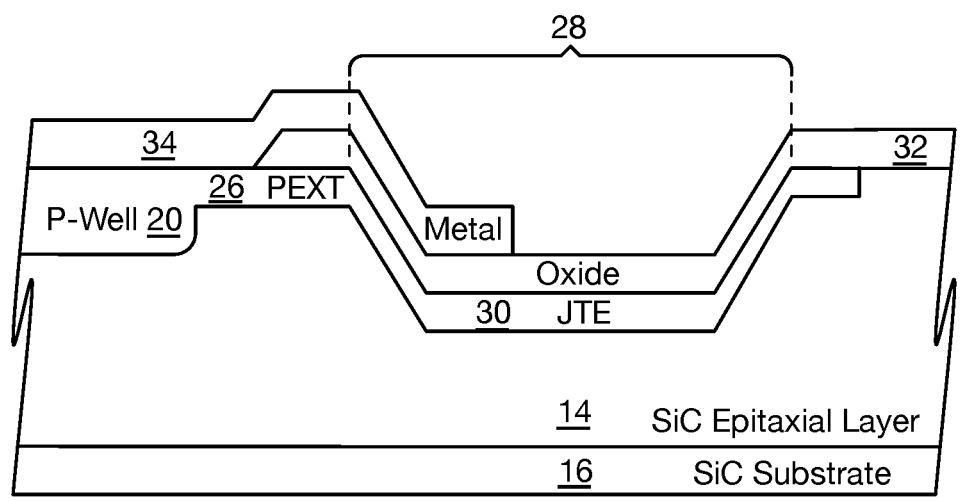
Figure 2H:
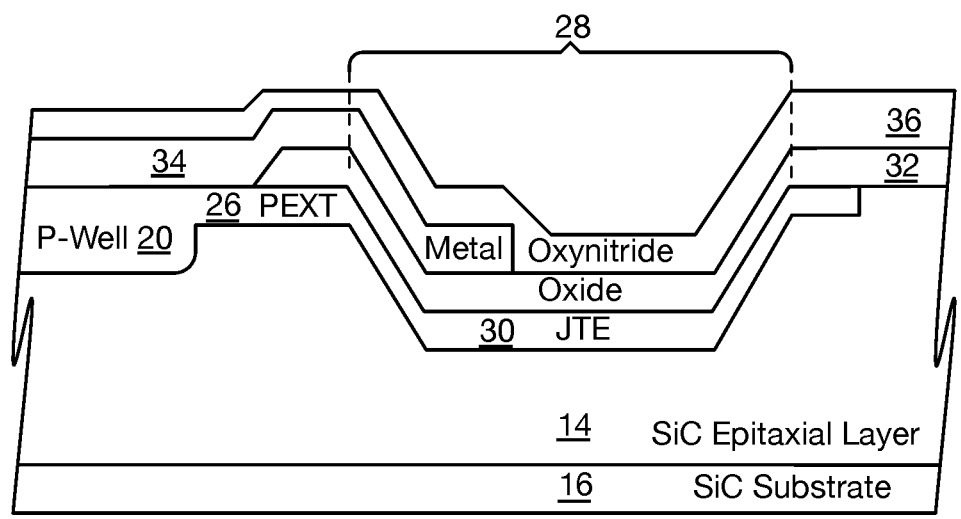
Figure 3A:
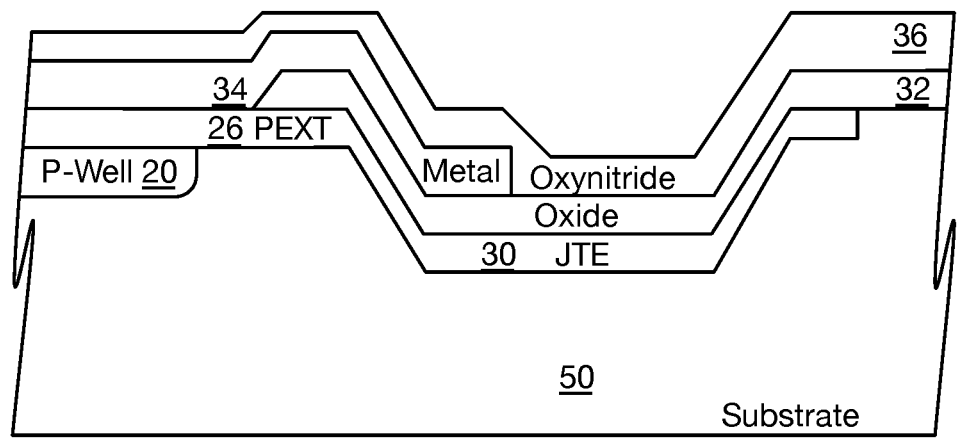
Figure 3B:
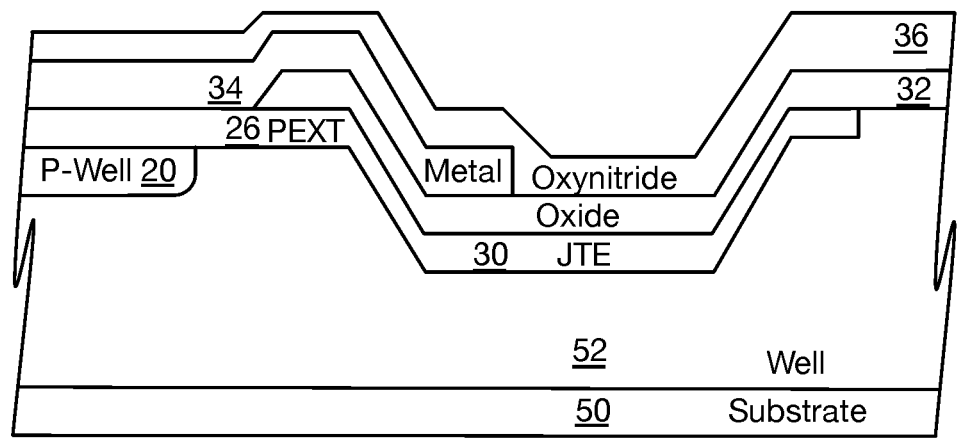

The invention will be explained in more detail in the following with reference to embodiments and to the drawing in which are shown:

FIG. 1 is a cross-sectional diagram of a portion of a semiconductor device including a high-voltage termination in accordance with an aspect of the present invention;

FIGS. 2A through 2H are cross-sectional diagrams of the high-voltage termination of FIG. 1 showing progressive steps in an illustrative fabrication process in accordance with an aspect of the present invention; and FIGS. 3A and 3B are cross-sectional diagrams of a portion of a semiconductor device including a high-voltage termination in accordance with an aspect of the present invention formed in different examples of substrates.

DETAILED DESCRIPTION

Persons of ordinary skill in the art will realize that the following description is illustrative only and not in any way limiting. Other embodiments will readily suggest themselves to such skilled persons.

The present invention is particularly advantageous when employed with silicon carbide (SiC) Schottky diodes and SiC MOSFETS but persons of ordinary skill in the art will appreciate that the present invention can be used with other devices.

The word "substrate" is used herein and may have several meanings that will be apparent from the context in which it is used. A substrate may be the layer in which the implanted regions are directly formed. In some instances it may be a substrate with no overlying layers. In other instances it may be in the form of an epitaxial layer formed over an underlying substrate. In other instances it may be in the form of a well structure formed in an underlying substrate. In any event persons of ordinary skill in the art will be readily able to determine the meaning of "substrate" by examining the context in which it is used.

Referring first of all to FIG. 1, an illustrative embodiment of high-voltage termination 10 for a semiconductor device in accordance with an aspect of the present invention is shown in cross-sectional view along with a SiC MOSFET transistor 12 to be protected. The particular embodiment shown in FIG. 1 is formed on an SiC epitaxial layer 14 grown on a SiC substrate 16 in a conventional manner. In one embodiment of the invention, the thickness of the SiC substrate 16 is about 350 µm+/−25 µm. The substrate 16 is doped with an n-type dopant, such as nitrogen, to achieve a typical resistivity of 0.02 ohm-cm and the epitaxial layer 14 is doped with nitrogen to a typical concentration of about 1e14/cm$^3$ to 2e16/cm$^3$.

The thickness of the epitaxial layer 14 is chosen depending on the desired voltage rating, and the thickness of the epitaxial layer 14 varies approximately linearly with the desired voltage rating. In addition, a good approximation for a JTE termination is that it has a length equal to about 3 times the thickness of the epitaxial layer 14. For example, the thickness of the epitaxial layer 14 for a 1700 V rating should be about 13.5 µm-thick which results in a 40.5 µm-long JTE termination. The epitaxial layer 14 thicknesses for 700 V, 1,200 V, 3,300 V, and 6,500 V ratings are 5 µm, 10 µm, 30 µm, and 60 µm respectively.

The MOSFET transistor 12 has a source region 18 formed in a p-well 20 disposed in the epitaxial layer 14. In exemplary embodiments of the invention aluminum or boron is used for doping of the p-well 20. In one illustrative embodiment of the invention, the p-well 20 is doped with aluminum or boron with a dose of between about 5e12 cm$^{-2}$ and about 1e15 cm$^{-2}$.

In the particular embodiment depicted in FIG. 1, the transistor 12 has a drain 22 formed on the back side of the substrate 16 and a gate 24 insulated from the surface of the epitaxial layer 14 as is known in the art. As will be appreciated by persons of ordinary skill in the art, the transistor 12 may take the form of an annular transistor or have other geometries such as, for example, long stripes. The present invention is applicable to all such transistor geometries.

A p-type doped extension (PEXT) region 26 is formed on the surface of the SiC epitaxial layer 14 and extends to and is connected to the p-well 20. The PEXT region 26 is doped with a species such as aluminum or boron. In one illustrative embodiment of the invention, the PEXT region 26 is doped with an implantation dose of about 1e13 cm$^{-2}$ to 1e15 cm$^{-2}$, although the present invention is not limited to this doping range. The PEXT region 26 is more heavily doped than the p-well 20. Junction depths of PEXT region 26 depend on the implantation energy which is usually between about 200 keV to 500 keV.

A shallow trench 28 having a length L and a depth D as shown in FIG. 1. The shallow trench 28 is formed in the upper surface of the SiC epitaxial layer 14 and intersects the PEXT region 26. In one embodiment the shallow trench 28 has a length L of about 20 μm to 50 μm. The shallow trench 28 is formed to a depth D of about 2 μm to 5 μm.

It has been found that the slope of the wall of the shallow trench 28 should be preferably optimized for any particular design and should preferably be between about 45° and about 60°.

A p-type doped junction termination extension (JTE) region 30 is formed in the shallow trench 28 and intersects the PEXT region 26. The JTE region 30 additionally extends beyond the edge of the trench 28 in the direction opposite the transistor 12. The p-type doped JTE region 30 is implanted with a species such as aluminum (or boron), and a dose of about 1e11/cm$^2$ to 1e13/cm$^2$ (typically about 1e12/cm$^2$). Preferably the doping of JTE region 30 is less than that of PEXT region 26, and further preferably 2 orders of magnitude less. The junction depth of JTE region 30 is about 1 μm. It is necessary that for any given design the JTE implantation dose be selected to assure that the JTE region is fully "depleted" under the reverse bias applied to the device. A dielectric layer 32 formed from for example deposited silicon dioxide (oxide) to a thickness of between about 1 μm to 3 μm is disposed over a portion of the PEXT region 26 and over the JTE region 30.

A metal layer 34 is disposed over a portion of the dielectric layer 32 and extends into the trench 28. The metal layer 34 extends beyond the edge of the trench 28 towards the transistor 12 and is in electrical contact with the source 18 of the transistor 12, with the p-well 20 and with PEXT region 26 through a via. The metal layer 34 is formed from a metal such as but not limited to a stack of titanium and aluminum to a thickness of between about 1 μm to 5 μm, depending on the application. The targeted thickness is measured with respect to a flat surface, and then conforms to the topology. For high power devices the thickness of the metal layer 34 can be about 5 μm. If the present invention is incorporated into a low voltage integrated circuit, then a 1 μm thick layer of the metal used for that technology will be satisfactory. A dielectric layer 36 formed from a material such as oxynitride to a thickness of between about 1 μm and about 4 μm is disposed over the portion of the dielectric layer 32 not covered by metal layer 34 and over the metal layer 34.

The length of the trench 28 plus the extension of the JTE region 30 beyond the edge of the trench 28 in the direction opposite the transistor 12 is referred to herein as the termination length. The JTE region 30 extends beyond the edge of the trench 28 in the direction opposite the transistor 12 by at least 1 μm and typically extends beyond the edge of the trench 28 by between about 1 μm and about 5 μm. The termination length is tailored to meet the blocking voltage requirement and is shown at arrows 38. In an embodiment where the blocking voltage is about 1,700 V, the termination length 38 is about 40.5 μm. The termination length 38 scales linearly with blocking voltage.

The high-voltage termination of the present invention presents a narrower design than other solutions such as floating field ring designs. The metal layer 34 acts as a field plate to extend the applied voltage to a defined area and spreads the charge to reduce the electric field and avoid avalanche breakdown at relatively low voltages. The high-voltage termination of the present invention presents a blocking voltage close to the full capability of the epitaxial layer 14 and exhibits a lower leakage current, hence improved reliability. The breakdown voltage is significantly higher for the high voltage termination structure that spans the termination length 38 than for the active area of the transistor 12, resulting in a higher reliability under harsh electrical and environmental conditions.

Referring now to FIGS. 2A through 2H, a series of cross-sectional diagrams show the structure resulting after selected steps in an illustrative fabrication process have been performed. In the illustrative embodiment depicted in FIGS. 2A through 2H, the p-well 20 for the transistor 12 is shown as being formed prior to the PEXT region 26 and the JTE region 30. Persons of ordinary skill in the art will appreciate that embodiments of the invention are contemplated where the PEXT region 26 and the JTE region 30 are formed prior to forming the p-well 20.

Referring first to FIG. 2A, a cross-sectional view shows the structure resulting after an epitaxial SiC layer 14 doped with an n-type dopant such as, for example, nitrogen to a concentration from between 1e14/cm$^3$ to 2e16/cm$^3$ has been formed on a SiC substrate 16 having a resistivity typically close to 0.02 ohm-cm using an epitaxy growth process as is known in the art. A p-well 20 has been formed in the epitaxial layer 14. In one illustrative embodiment of the invention, the p-well 20 is doped with aluminum or boron with a dose of between about 5e12 cm$^{-2}$ and about 1e15 cm$^{-2}$.

Referring now to FIG. 2B, a cross-sectional view shows the structure resulting after a p-type doped extension (PEXT) region 26 has been formed using a masked implant process as is known in the art and the mask has been removed. The PEXT region 26 has been implanted using a dopant species such as aluminum (or boron) with a dose of between about 1e13/cm$^2$ to 1e15/cm$^2$, with an implant energy of from about 200 keV to 500 keV although the invention is not limited to this range. The PEXT region 26 partially overlaps the p-well 20 in an area opposite where the channel of the transistor 12 of FIG. 1 will be formed and will result in the dopant concentration of that portion of the p-well 20 being higher than the portion of the p-well 20 that is proximate to the channel of the transistor 12 of FIG. 1. This will not affect the performance of the transistor 12. The PEXT region 26 is generally more heavily doped than the p-well 20.

Referring now to FIG. 2C, a cross-sectional view shows the structure resulting after a shallow trench 28 has been formed in the epitaxial SiC layer 12 using conventional semiconductor processing techniques. In one embodiment of the invention the shallow trench 28 has a length of about 20 μm to 50 μm, depending on the blocking voltage requirement, and is formed to a depth of about 2 μm to 5 μm. The shallow trench 28 consumes a portion of the PEXT implant 26 as shown in FIG. 2C.

Referring now to FIG. 2D, a cross-sectional view shows the structure resulting after a p-type doped junction termination extension (JTE) region 30 has been formed in the trench 28 using a masked implant process as is known in the art and the mask has been removed. The p-type doped JTE region 30 intersects the p-type extension region 26 and further extends beyond the edge of the trench 28 in the direction opposite the transistor 12 by at least 1 µm and typically extends beyond the edge of the trench 28 by between about 1 µm and about 5 µm. FIG. 2D shows the JTE region 30 separately from the PEXT implant 26 to illustrate the edges of the mask used to perform the masked implant process.

The p-type doped JTE region 30 is doped with a species such as aluminum or boron, using an implant dose of from about $1e11/cm^2$ to $1e13/cm^2$ (typically about $1e12/cm^2$). Preferably the doping of JTE region 30 is less than that of PEXT region 26, and further preferably 2 orders of magnitude less. The junction depth may be about 1 µm.

Referring now to FIG. 2E, a cross-sectional view shows the structure resulting after an activation step has been performed to activate the implanted dopant atoms in PEXT region 26 and p-type doped JTE region 30.

Referring now to FIG. 2F, a cross-sectional view shows the structure resulting after a dielectric layer 32 has been formed from, for example, deposited silicon dioxide to a thickness of between about 1 µm to 3 µm over the surface of the structure including the PEXT and p-type doped JTE regions 26 and 30. The dielectric layer 32 extends past the edges of the p-type doped JTE region 30. A via 40 has been formed in the dielectric layer 32 using conventional semiconductor processing techniques to expose the upper surface of the PEXT region 26 outside of the edge of the shallow trench 28 as well as the source 18 of the transistor 12 and the p-well 20 (as shown in FIG. 1).

Referring now to FIG. 2G, a cross-sectional view shows the structure resulting after a metal layer 34 has been deposited and patterned using a metal such as, but not limited to, a stack of titanium and aluminum employing conventional semiconductor processing techniques over the surface of the structure and into the via 40 to make an electrical connection to the PEXT region 26 and to the source 18 of the transistor 12 and p-well 20 (as shown in FIG. 1). The thickness of the metal layer 34 is typically between about 1 µm to 5 µm, depending on the application. Power devices will employ thicker metal layers. If the present invention is practiced in an integrated circuit then a 1 µm thick layer of the metal used for that technology will be satisfactory.

Referring now to FIG. 2H, a cross-sectional view shows the structure resulting after a dielectric layer 36 formed from a material such as silicon oxynitride has been deposited over the exposed portion of the dielectric layer 32 and the metal layer 34.

Persons of ordinary skill in the art will appreciate that while the present invention has been disclosed using illustrative embodiments where p-type implants are used in n-type substrates and wells, it should be apparent that embodiments that employ n-type implants in p-type substrates and wells are contemplated to be within the scope of the present invention.

Persons of ordinary skill in the art will appreciate that the SiC epitaxial layer 14 over SiC substrate 16 embodiment described with reference to FIGS. 1 and 2A through 2H is illustrative only and is non-limiting. Such skilled persons will appreciate that the high-voltage termination structure of the present invention may be formed using other technologies. FIGS. 3A and 3B illustrate how the present invention may be practiced using two other exemplary technologies.

FIG. 3A shows an embodiment of the high-voltage termination structure of the present invention formed on a substrate 50. Substrate 50 may be an n-type substrate and the PEXT region 26 and JTE region 30 may be p-type implants. Substrate 50 may also be a p-type substrate and the PEXT region 26 and p-type doped JTE region 30 may be replaced with n-type regions.

FIG. 3B shows an embodiment of the high-voltage termination structure of the present invention formed in a well 52 formed in a substrate 50. The well 52 may be an n-well formed in a p-type substrate 50 and the PEXT region 26 and JTE region 30 may be p-type regions. The well 52 may also be a p-well formed in an n-type substrate and the PEXT region 26 and p-type doped JTE region 30 may be replaced with n-type regions.

The present invention may be employed in high-voltage designs where the output voltage nodes can support voltages up to about 10,000 V.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A high-voltage termination for a semiconductor device comprising:
    a substrate of a first conductivity type;
    a well of a second conductivity type opposite the first conductivity type formed at a top surface of, and extending into the substrate of the first conductivity type
    an implanted device region of the first conductivity type formed at the top surface of, and extending into the well of the second conductivity type, the implanted device region forming a part of the semiconductor device;
    a shallow trench disposed in the substrate, the shallow trench having sloped sidewalls, a first edge that is adjacent to the well and a second edge on the opposite side of the shallow trench;
    a doped extension region of the second conductivity type formed in the substrate, the doped extension region having a doping concentration greater than a doping concentration of the well and extending between the well and the first edge of the shallow trench;
    a junction termination extension region of the second conductivity type formed beneath the shallow trench and contacting the doped extension region, the junction termination region having a doping concentration less than the doping concentration of the doped extension region and extending past the second edge of the shallow trench;
    an insulating layer formed directly over at least a portion of the doped extension region and directly over the junction termination extension region; and
    a metal layer formed over the insulating layer, the metal layer extending into at least a portion of the shallow trench, the metal layer electrically connected through a via in the insulating layer to the doped extension region.

2. The high-voltage termination of claim 1 wherein a distance from the first edge of the shallow trench to the second edge of the shallow trench, and a length of a portion of the junction termination extension region that extends past the second edge of the shallow trench together form a termination length of the high-voltage termination.

3. The high-voltage termination of claim 1 further comprising a second insulating layer formed over the metal layer and the insulating layer.

4. The high-voltage termination of claim 1 wherein the substrate of the first conductivity type is an epitaxial layer disposed over an underlying substrate.

5. The high-voltage termination of claim 4 wherein:
the epitaxial layer is an epitaxial SiC layer; and
the underlying substrate is a SiC substrate.

6. The high-voltage termination of claim 5 wherein:
the epitaxial SiC layer is doped with nitrogen; and
the underlying SiC substrate is doped with nitrogen.

7. The high-voltage termination of claim 6 wherein:
the epitaxial SiC layer is doped with nitrogen to a concentration of from about $1e14/cm^3$ to about $2e16/cm^3$; and
the underlying SiC substrate is doped with nitrogen to a resistivity of about 0.02 ohm-cm.

8. The high-voltage termination of claim 1 wherein:
the doped extension region is implanted with one of aluminum and boron; and
the junction termination extension region is implanted with one of aluminum and boron.

9. The high-voltage termination of claim 8 wherein:
the doped extension region is implanted with one of aluminum and boron with a dose of between about $1e13/cm^2$ to about $1e15/cm^2$; and
the junction termination extension region is implanted with one of aluminum and boron with a dose of between about $1e11/cm^2$ to about $1e13/cm^2$.

10. The high-voltage termination of claim 1,
wherein the shallow trench has a depth of between about 2 µm to about 5 µm; and
wherein a length of the shallow trench is a distance from the first edge of the shallow trench to the second edge of the shallow trench,
wherein the high-voltage termination has a termination length defined by the length of the shallow trench and an extension of the junction termination extension region beyond the second edge of the trench, and
wherein the termination length is selected to withstand a preselected blocking voltage.

11. The high-voltage termination of claim 2 wherein the termination length is between about 20 µm to about 55 µm.

12. A transistor with high-voltage termination, comprising:
a substrate of a first conductivity type;
a drain region formed in a back side of the substrate;
a well of a second conductivity type opposite the first conductivity type formed at a top surface of, and extending into, the substrate;
a source region formed within the well;
a gate disposed over the source and drain regions;
a shallow trench disposed in the substrate, the shallow trench having sloped sidewalls, a first edge that is adjacent to the well and a second edge on the opposite side of the shallow trench;
a doped extension region of the second conductivity type, opposite the first conductivity type, formed in the substrate and extending from the first edge of the shallow trench and contacting the well;
a junction termination extension region of the second conductivity type formed beneath the shallow trench and contacting the doped extension region, the junction termination extension region extending past the second edge of the shallow trench;
an insulating layer formed directly over at least a portion of the extension region and directly over the junction termination extension region; and
a metal layer formed over the insulating layer, the metal layer extending into at least a portion of the shallow trench, the metal layer electrically connected through a via in the insulating layer to the doped extension region.

13. The transistor of claim 12,
wherein the well is a p-well,
wherein the junction termination extension region has a doping concentration less than a doping concentration of the doped extension region, and
wherein the doping concentration of the doped extension region is greater than a doping concentration of the well.

14. The transistor of claim 12 wherein a distance from the first edge of the shallow trench to the second edge of the shallow trench, and a length of a portion of the junction termination extension region that extends past the second edge of the shallow trench together form a termination length of the high-voltage termination for the transistor.

* * * * *